(12) United States Patent
Ota et al.

(10) Patent No.: US 8,558,367 B2
(45) Date of Patent: Oct. 15, 2013

(54) SEMICONDUCTOR MODULE

(75) Inventors: Tatsuo Ota, Tokyo (JP); Toshiaki Shinohara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 16 days.

(21) Appl. No.: 13/365,409

(22) Filed: Feb. 3, 2012

(65) Prior Publication Data
US 2013/0009298 A1 Jan. 10, 2013

(30) Foreign Application Priority Data

Jul. 4, 2011 (JP) .................... 2011-148221

(51) Int. Cl.
*H01L 23/24* (2006.01)
(52) U.S. Cl.
USPC .................. 257/687; 257/E23.124
(58) Field of Classification Search
None
See application file for complete search history.

(56) References Cited

U.S. PATENT DOCUMENTS

| 7,449,726 B2 | 11/2008 | Nakanishi et al. |
| 7,528,485 B2 | 5/2009 | Morita et al. |
| 7,589,412 B2 | 9/2009 | Kashimoto et al. |
| 7,671,382 B2 | 3/2010 | Sudo et al. |
| 7,768,118 B2 | 8/2010 | Yoshida et al. |
| 2003/0201530 A1* | 10/2003 | Kurihara et al. ............. 257/712 |
| 2010/0244213 A1 | 9/2010 | Nozaki |

FOREIGN PATENT DOCUMENTS

| JP | 2010-238892 | 10/2010 |
| JP | 2011-103367 | 5/2011 |

OTHER PUBLICATIONS

Office Action (with English translation) issued on May 31, 2013, in counterpart German appln No. 10 2012 210 440.2 (9 pages).

* cited by examiner

*Primary Examiner* — Michael Lebentritt
*Assistant Examiner* — Kevin Quinto
(74) *Attorney, Agent, or Firm* — Oblon, Spivak, McClelland, Maier & Neustadt, L.L.P.

(57) ABSTRACT

A semiconductor module includes: an insulating plate; a plurality of metal patterns formed on the insulating plate and spaced apart from each other; a power device chip solder-joined on one the metal pattern; a lead frame solder-joined on the metal pattern to which the power device chip is not solder-joined, and on the power device chip; an external main electrode provided to an outer casing, and joined by wire bonding to the lead frame above the metal pattern to which the power device chip is not joined; and a sealing resin formed by potting to seal the power device chip, the lead frame, and the metal patterns.

5 Claims, 3 Drawing Sheets

F I G . 4
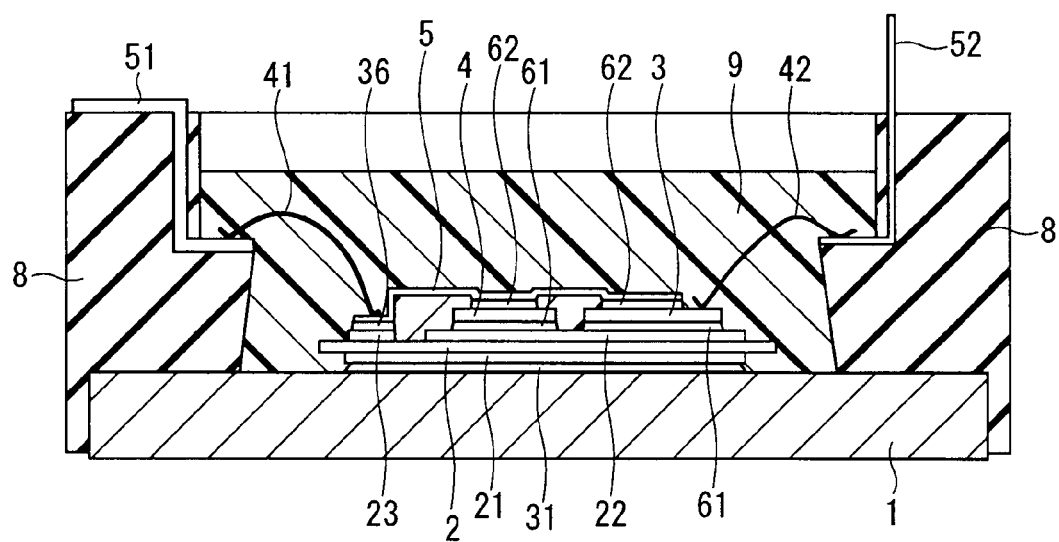

SEMICONDUCTOR MODULE

BACKGROUND OF THE INVENTION

1. Field of the Invention

The present invention relates to a semiconductor module, and more specifically, relates to a structure for connecting a power device chip and an external electrode.

2. Description of the Background Art

A technique called wire bonding has been employed since 1980s as means of taking current out of a power device (see Japanese Patent Application Laid-Open No. 2010-238892). In the wire bonding technique, an electrode part of the power device and an external electrode are connected by using a thin aluminum or gold wire. However, this technique shortens the life span of a joint part formed by wire bonding due to heat stress generated by turning the power device on and off repeatedly. So, the maximum junction temperature should be set low if increase of a life span is given higher priority, resulting in the size increase or cost increase of a power module.

In response, direct lead bonding (DLB) technique has been suggested that is intended to enhance the reliability of a joint part. In the DLB technique, a lead frame is directly connected to an electrode part of an element on a surface of the element.

Further, transfer molding technique has been employed as a technique of sealing a power device (see Japanese Patent Application Laid-Open No. 2011-103367). For molding by the transfer molding technique, heated and pressurized resin is injected into a closed mold.

While enhancing the reliability of a joint part, the DLB technique entails higher cost than the wire bonding technique.

Further, sealing of a power device using the transfer molding technique achieves excellent reliability and excellent productivity. However, the transfer molding technique involves a large amount of initial investment to prepare a mold, for example, placing limitations on the degree of freedom of a terminal shape or dimensions. So, applying the transfer molding technique to a product group of a wide variety of types, or to a small group of products causes a problem of cost increase.

SUMMARY OF THE INVENTION

It is an object of the present invention to provide a semiconductor module that can be manufactured at low cost while the reliability of an electrode terminal thereof is maintained.

A first semiconductor module of the present invention includes an insulating plate, a plurality of metal patterns, a power device chip, a lead frame, an external main electrode, and a sealing resin. The plurality of metal patterns are formed on the insulating plate and spaced apart from each other. The power device chip is solder-joined on one of the metal patterns. The lead frame is solder-joined on a metal pattern to which the power device chip is not solder-joined, and on the power device chip. The external main electrode is provided to an outer casing, and joined by wire bonding to the lead frame above the metal pattern to which the power device chip is not joined. The sealing resin is formed by potting to seal the power device chip, the lead frame, and the metal patterns.

In the first semiconductor module of the present invention, the lead frame is solder-joined on the power device chip. This increases a joint area compared to that obtained by wire bonding, thereby providing high reliability of resistance to heat stress to be generated by turning on and off the power device chip. Further, one end of the lead frame is joined on the metal pattern different from the metal pattern on which the power device chip is placed, making it possible to reduce the temperature of the lead frame during the semiconductor module is in operation. Sill further, the lead frame and the external main electrode are joined to each other by wire bonding on the metal pattern at a temperature lower than that around the power device chip. So, even inexpensive wire bonding can maintain reliability at a high level. In addition, formation of the sealing resin by potting does not place many limitations on the shape or dimension of a terminal. This allows the semiconductor module to be applied easily to a product group of a wide variety of types, or to a small group of products.

A second semiconductor module of the present invention includes an insulating plate, a metal pattern, a power device chip, an insulating spacer, a lead frame, an external main electrode, and a sealing resin. The metal pattern is formed on the insulating plate. The power device chip and the insulating spacer are separately solder-joined on the metal pattern. The lead frame is solder-joined on the power device chip and the insulating spacer. The external main electrode is provided to an outer casing, and joined by wire bonding to the lead frame above the insulating spacer. The sealing resin is formed by potting to seal the power device chip, the insulating spacer, the lead frame, and the metal pattern.

In the second semiconductor module of the present invention, provision of the single metal pattern on the insulating plate increases the temperature of a junction between the lead frame and a bonding wire, compared to the case where divided metal patterns are provided. However, provision of the single metal pattern prevents insulation degradation between different electrodes, thereby enhancing insulating strength.

A third semiconductor module of the present invention includes an insulating plate, a metal pattern, a power device chip, a free-wheeling diode chip, a lead frame, an external main electrode, and a sealing resin. The metal pattern is formed on the insulating plate. The power device chip and the free-wheeling diode chip are separately solder-joined on the metal pattern. The lead frame is solder-joined on the power device chip and the free-wheeling diode chip. The external main electrode is provided to an outer casing, and joined by wire bonding to the lead frame above the free-wheeling diode chip. The sealing resin is formed by potting to seal the power device chip, the free-wheeling diode chip, the lead frame, and the metal pattern.

In the third semiconductor module of the present invention, the lead frame is wire-bonded to the external main electrode above the free-wheeling diode chip. So, the temperature of a junction part thereof is made higher. However, the size of the lead frame can be made closer to the projected areas of the power device chip and the free-wheeling diode chip, allowing size reduction of the semiconductor module. This structure is applied usefully if size reduction is given priority than the life span of a semiconductor module.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a sectional view showing the structure of a semiconductor module of a fourth preferred embodiment.

EMBODIMENT FOR CARRYING OUT THE INVENTION

First Preferred Embodiment

Figure 1:
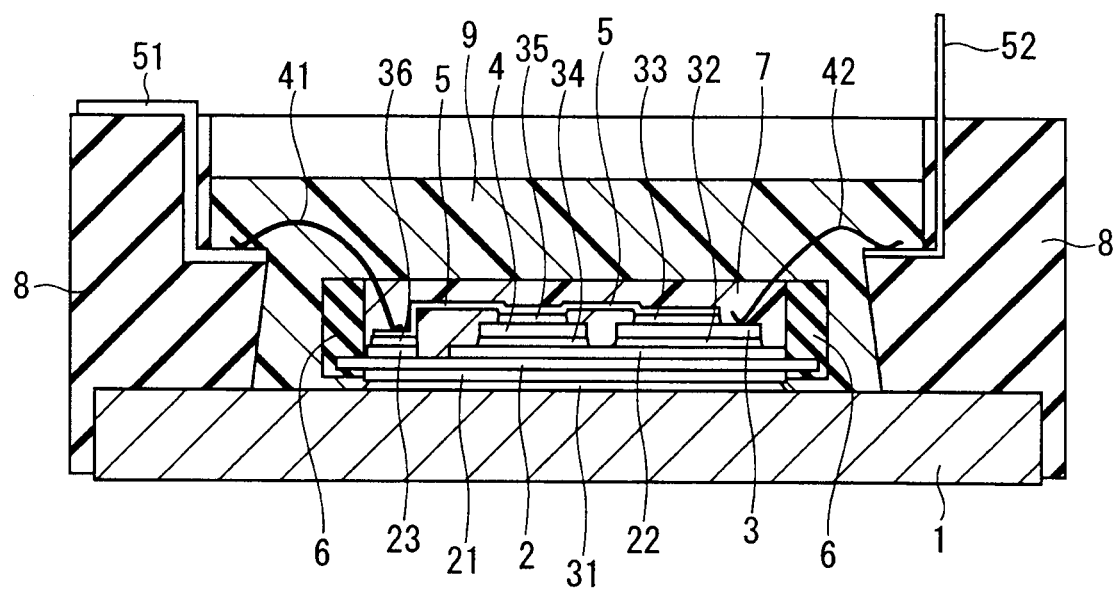
FIG. 1 is a sectional view showing the structure of a semiconductor module of a first preferred embodiment.

FIG. 1 is a sectional view showing the structure of a semiconductor module of a first preferred embodiment. The semiconductor module includes a base plate 1 made of metal such as copper, aluminum and AlSiC, and an insulating substrate joined onto the base plate 1 through solder 31. The structure of the insulating substrate is such that patterns of metal such as copper or aluminum are formed on opposite sides of a ceramic insulating plate 2 by etching technique. A metal pattern 21 is formed on the rear surface of the insulating plate 2, and the metal pattern 21 is joined through solder 31 to the base plate 1. Metal patterns 22 and 23 are formed on the front surface of the insulating plate 2. A power device chip 3 that may be an IGBT or an MOSFET, and a free-wheeling diode chip 4 are joined on the metal pattern 22 through solder 32 and solder 34 respectively.

A lead frame 5 is joined on the power device chip 3 and the free-wheeling diode chip 4 through solder 33 and solder 35 respectively to connect the power device chip 3 and the free-wheeling diode chip 4 in parallel. The lead frame 5 has one end joined to the power device chip 3, and the opposite end joined to the metal pattern 23 through solder 36. Using copper as the lead frame 5 can enhance the resistance of the lead frame 5 itself to heat.

An external main electrode 51 and an external signal electrode 52 are provided to an outer casing 8 by insert or outsert molding. The lead frame 5 is connected through an aluminum wire 41 to the external main electrode 51 at a position where the lead frame 5 is joined to the metal pattern 23. The external signal electrode 52 is connected through an aluminum wire 42 to the power device chip 3. The aluminum wire 41 generally has a diameter of from 200 to 500 µm, and the aluminum wire 42 generally has a diameter of from 50 to 150 µm.

After the metal patterns 21, 22 and 23 are formed on the insulating plate 2, a dam 6 made of Si rubber is formed by using a mold to surround the insulating plate 2. A liquid epoxy resin 7 is poured by potting into the dam 6 and then cured thermally. The epoxy resin 7 protects the solder 33 and the solder 35 from heat cycle stress to be generated by turning on and off of the power device chip 3 and the free-wheeling diode chip 4.

Further, a low-elastic sealing resin 9 such as silicone gel is poured into the outer casing 8 from above the epoxy resin 7 for insulation protection of the aluminum wires 41 42, the external main electrode 51, and the external signal electrode 52 that are not sealed with the epoxy resin 7.

Effects

The semiconductor module of the first preferred embodiment includes: the insulating plate 2; the metal patterns 22 and 23 formed on the insulating plate 2 and spaced apart from each other; the power device chip 3 solder-joined on the metal pattern 22; the lead frame 5 solder-joined on the metal pattern 23 to which the power device chip 3 is not solder-joined, and on the power device chip 3; the external main electrode 51 provided to the outer casing 8 and joined by wire bonding to the lead frame 5 above the metal pattern 23 to which the power device chip 3 is not joined; and the sealing resin (epoxy resin) 7 formed by potting to seal the power device chip 3, the lead frame 5, and the metal patterns 22 and 23. The solder joining of the lead frame 5 on the power device chip 3 increases a joint area compared to that obtained by wire bonding, thereby providing high reliability of resistance heat stress to be generated by turning on and off the power device chip 3. One end of the lead frame 5 is joined on the metal pattern 23 apart from the metal pattern 22 on which the power device chip 3 and the free-wheeling diode chip 4 are placed, making it possible to reduce the temperature of the lead frame 5 during the semiconductor module is in operation. Further, the lead frame 5 and the external main electrode 51 are joined to each other by wire bonding on the metal pattern 23 at a temperature lower than that around the power device chip 3. So, even inexpensive wire bonding can maintain reliability at a high level. In addition, formation of the epoxy resin 7 by potting does not place many limitations on the shape or dimension of a terminal. This allows the semiconductor module to be applied easily to a product group of a wide variety of types, or to a small group of products.

The semiconductor module of the first preferred embodiment uses an epoxy resin in a liquid form as a sealing resin to be formed by potting, so that the solder-joined part of the upper surface of the power device chip 3 is protected from heat stress to be generated by turning on and off the power device chip 3.

The semiconductor module of the first preferred embodiment includes the silicone resin 9 to seal part of the inside of the outer casing 8 that is not sealed with the sealing resin 7 formed by potting, allowing insulation protection of the external main electrode 51 and the aluminum wire 41.

Second Preferred Embodiment

Structure

It been confirmed by experiment that insulation degradation is generated with high probability between different electrodes. So, in a second preferred embodiment, only a single metal pattern is formed on the insulating plate 2 to maintain a single potential to enhance insulation properties.

Figure 2:
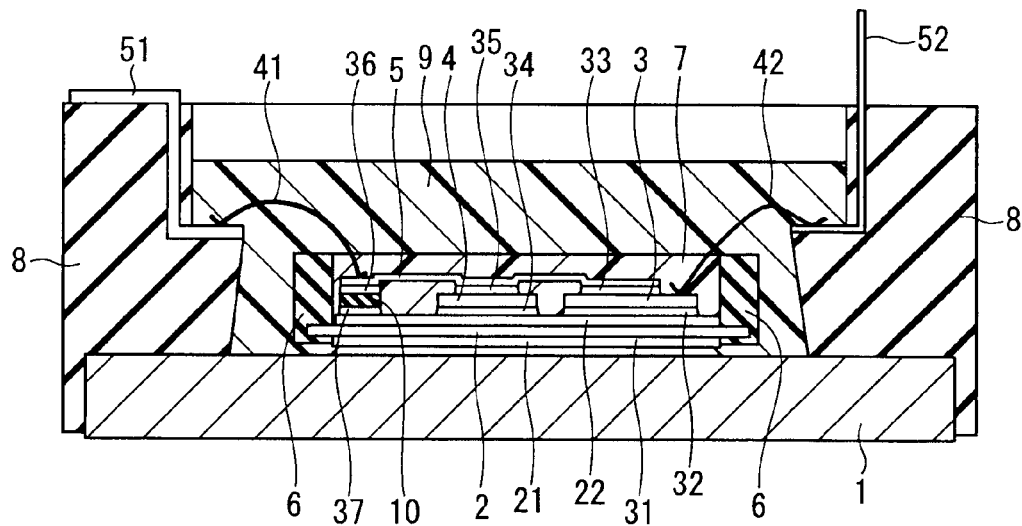
FIG. 2 is a sectional view showing the structure of a semiconductor module of a second preferred embodiment.

FIG. 2 is a sectional view showing the structure of a semiconductor module of the second preferred embodiment. In this semiconductor module, only the metal pattern 22 is formed on the insulating plate 2, and the power device chip 3 and the free-wheeling diode chip 4 are joined on the metal pattern 22 through the solder 32 and the solder 34 respectively. Further, an insulating spacer 10 is joined through solder 37 to an end portion of the metal pattern 22 away from the power device chip 3. The lead frame 5 is joined through the solder 36 on the insulating spacer 10. The insulating spacer 10 is provided to insulate the lead frame 5 from the metal pattern 22. The insulating spacer 10 has a linear expansion coefficient substantially the same as that of the epoxy resin 7 (±20% the linear expansion coefficient of the epoxy resin 7), and has a function of supporting the load of the aluminum wire 41.

The lead frame 5 is joined on the power device chip 3 that may be an IGBT or an MOSFET and the free-wheeling diode chip 4 through the solder 33 and the solder 35 respectively to connect the power device chip 3 and the free-wheeling diode chip 4 in parallel. The lead frame 5 has one end joined to the power device chip 3, and the opposite end joined to the insulating spacer 10 through the solder 36. The lead frame 5 is connected through the aluminum wire 41 to the external main electrode 51 at a position where the lead frame 5 is joined to the insulating spacer 10.

The structure of the second embodiment in other respects is the same as that of the first preferred embodiment, so it will not be described again.

Effects

The semiconductor module of the second preferred embodiment includes: the insulating plate 2; the metal pattern 22 formed on the insulating plate 2; the power device chip 3 and the insulating spacer 10 separately solder-joined on the metal pattern 22; the lead frame 5 solder-joined on the power device chip 3 and the insulating spacer 10; the external main electrode 51 provided to the outer casing 8 and joined by wire bonding to the lead frame 5 above the insulating spacer 10; and the sealing resin 7 formed by potting to seal the power device chip 3, the insulating spacer 10, the lead frame 5, and the metal pattern 22. Provision of only the metal pattern 22 on the insulating plate 2 increases the temperature of a junction between the lead frame 5 and the aluminum wire 41, compared to the case where divided metal patterns are provided. However, provision of only the metal pattern 22 prevents insulation degradation between different electrodes, thereby enhancing insulating strength. Further, stress generated between the base plate 1 and the insulating substrate is equalized.

Third Preferred Embodiment

Structure

Figure 3:
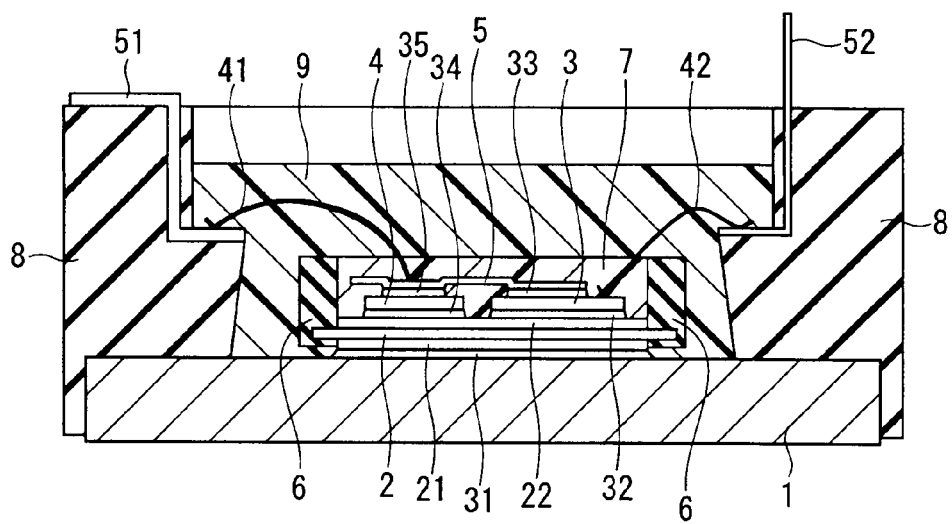
FIG. 3 is a sectional view showing the structure of a semiconductor module of a third preferred embodiment.

FIG. 3 is a sectional view showing the structure of a semiconductor module of a third preferred embodiment. The third preferred embodiment is intended to reduce the size of the semiconductor module by making the size of the lead frame 5 smaller than those in the first and second preferred embodiments.

The metal pattern 22 is formed on a surface of the insulating plate 2. The power device chip 3 and the free-wheeling diode chip 4 are joined on the metal pattern 22 through the solder 32 and the solder 34 respectively.

The lead frame 5 is joined on the power device chip 3 that may be an IGBT or an MOSFET and the free-wheeling diode chip 4 through the solder 33 and the solder 35 respectively to connect the power device chip 3 and the free-wheeling diode chip 4 in parallel. The lead frame 5 is connected through the aluminum wire 41 to the external main electrode 51 above the free-wheeling diode chip 4. The free-wheeling diode chip 4 increases in temperature at a rate lower than that of the power device chip 3. So, compared to the case where the lead frame 5 is wire-bonded above the power device chip 3, a junction part is provided with higher reliability. The structure of the third embodiment in other respects is the same as that of the first preferred embodiment, so it will not be described again.

Effects

The semiconductor module of the third preferred embodiment includes: the insulating plate 2; the metal pattern 22 formed on the insulating plate 2; the power device chip 3 and the free-wheeling diode chip 4 separately solder-joined on the metal pattern 22; the lead frame 5 solder-joined on the power device chip 3 and the free-wheeling diode chip 4; the external main electrode 51 provided to the outer casing 8 and joined by wire bonding to the lead frame 5 above the free-wheeling diode chip 4; and the sealing resin 7 formed by potting to seal the power device chip 3, the free-wheeling diode chip 4, the lead frame 5, and the metal pattern 22. The lead frame 5 is wire-bonded to the external main electrode 51 above the free-wheeling diode chip 4, so the temperature of a junction part is made higher than those in the first and second embodiments. However, the size of the lead frame 5 can be made closer to the projected areas of the power device chip 3 and the free-wheeling diode chip 4, allowing size reduction of the semiconductor module. This structure is applied usefully if size reduction is given higher priority than the life span of a semiconductor module.

Fourth Preferred Embodiment

In the first preferred embodiment, the power device chip 3 and the free-wheeling diode chip 4 are solder-joined to the lead frame 5 and the metal pattern 22. Meanwhile, silver nanoparticle joint layers 61 and 62 may take the place of the solder 32, 33, 34 or 35.

Silver nanoparticle joining is a technique by which Ag particles (silver nanoparticles) of diameters in units of nanometers are sintered by applying pressure or heat to join the particles. Use of this technique realizes low resistance and stability of a junction part. Further, the melting point of silver nanoparticles is higher than solder, so that joining with silver nanoparticles can provide higher resistance to heat than solder joining.

Thus, if the silver nanoparticle joint layers 61 and 62 are used, the dam 6 and the epoxy resin 7 may be omitted, and the inside of the outer casing 8 may entirely be sealed with the silicone gel 9 in the structure of FIG. 1. A semiconductor module of this structure is shown in FIG. 4.

The structure of FIG. 4 does not involve a step of forming a dam and a step of pouring an epoxy resin, making it possible to simplify manufacturing process.

The same effect can be achieved if silver nanoparticle joining is used for joining of the opposite surfaces of the power device chip 3 and the free-wheeling diode chip 4, and if the dam 6 and the epoxy resin 7 are omitted in the structures of the semiconductor modules of the second and third preferred embodiments shown in FIGS. 2 and 3 respectively.

Effects

In the semiconductor module of the fourth preferred embodiment, the power device chip 3 is joined to the metal pattern 22 and the lead frame 5 through the silver nanoparticle joint layers 61 and 62 and not by solder joining. This allows the semiconductor module to respond to higher operating temperature of the chip.

In the semiconductor module of the fourth preferred embodiment, the epoxy resin 7 as a sealing resin to be formed by potting is not provided, and part to be sealed by the epoxy resin 7 is sealed with the silicone resin 9 instead. Use of silver nanoparticle joining for joining of the power device chip 3 with the lead frame 5 and the metal pattern 22 provides higher reliability of resistance to heat cycle than use of solder joining, making it possible to omit the epoxy resin 7. As a result, a step of forming a dam and a step of pouring an epoxy resin can be omitted, making it possible to simplify manufacturing process.

While the invention has been shown and described in detail, the foregoing description is in all aspects illustrative and not restrictive. It is therefore understood that numerous modifications and variations can be devised without departing from the scope of the invention.

What is claimed is:

1. A semiconductor module, comprising:
    an insulating plate;
    a metal pattern formed on said insulating plate;
    a power device chip and a free-wheeling diode chip separately solder-joined on said metal pattern;
    a lead frame solder-joined on said power device chip and said free-wheeling diode chip;
    an external main electrode provided to an outer casing, and joined by wire bonding to said lead frame above said free-wheeling diode chip; and
    a sealing resin formed by potting to seal said power device chip, said free-wheeling diode chip, said lead frame, and said metal pattern.

2. The semiconductor module according to claim 1, wherein said sealing resin is formed by curing a liquid epoxy resin.

3. The semiconductor module according to claim 1, wherein said power device chip is joined to said metal pattern and said lead frame by silver nanoparticle joining instead of solder joining.

4. The semiconductor module according to claim 1, further comprising a silicone resin for sealing part of the inside of said outer casing, the part sealed with the silicone resin being different from part sealed with said sealing resin formed by potting.

5. The semiconductor module according to claim 4, wherein said sealing resin formed by potting is not provided, and said part to be sealed with said sealing resin is sealed with said silicone resin.

* * * * *